United States Patent
Huang et al.

(10) Patent No.: US 9,563,091 B2
(45) Date of Patent: Feb. 7, 2017

(54) PIXEL STRUCTURE

(71) Applicant: Au Optronics Corporation, Hsinchu (TW)

(72) Inventors: Chun-Ru Huang, New Taipei (TW); Pei-Chun Liao, Hsinchu County (TW); Che-Chia Chang, Hsinchu (TW); Yu-Ling Yeh, Kaohsiung (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 14/637,404

(22) Filed: Mar. 4, 2015

(65) Prior Publication Data

US 2016/0062197 A1    Mar. 3, 2016

(30) Foreign Application Priority Data

Sep. 1, 2014 (CN) .......................... 2014 1 0441764

(51) Int. Cl.
| | |
|---|---|
| *H01L 27/14* | (2006.01) |
| *G02F 1/1343* | (2006.01) |
| *G02F 1/1368* | (2006.01) |
| *H01L 27/12* | (2006.01) |

(52) U.S. Cl.
CPC ....... *G02F 1/134363* (2013.01); *G02F 1/1368* (2013.01); *H01L 27/124* (2013.01); *G02F 2001/134372* (2013.01)

(58) Field of Classification Search
CPC ............ G02F 1/134363; G02F 1/13624; G02F 1/13439
USPC .............................. 257/59, 72; 438/149–167
See application file for complete search history.

(56) References Cited

U.S. PATENT DOCUMENTS

| | | | |
|---|---|---|---|
| 7,932,980 | B2 | 4/2011 | Ge et al. |
| 8,334,955 | B2 | 12/2012 | Ge et al. |
| 8,520,156 | B2 | 8/2013 | Park et al. |
| 8,830,432 | B2 | 9/2014 | Tsai et al. |
| 2005/0286003 | A1* | 12/2005 | Lee ................... G02F 1/134363 349/141 |
| 2007/0115417 | A1 | 5/2007 | Ge et al. |

(Continued)

FOREIGN PATENT DOCUMENTS

| | | |
|---|---|---|
| CN | 1971364 | 5/2007 |
| CN | 102455558 | 5/2012 |
| TW | 201300910 | 1/2013 |

*Primary Examiner* — Brook Kebede
(74) *Attorney, Agent, or Firm* — Jianq Chyun IP Office

(57) ABSTRACT

A pixel structure is provided. The pixel structure includes a scan line, a data line, an active device, a pixel electrode, and a common electrode. The active device is electrically connected to the scan line and the data line. The pixel electrode is electrically connected to the active device. The pixel electrode includes multiple first layer pixel electrode patterns and multiple second layer pixel electrode patterns. The common electrode includes a plurality of first layer common electrode patterns and a plurality of second layer common electrode patterns. A fringe electric field is between each first layer pixel electrode pattern and corresponding portion of second layer common electrode patterns, and between each first layer common electrode pattern and corresponding portion of second layer pixel electrode patterns. A horizontal electric field is between each second layer pixel electrode pattern and the adjacent portion of second layer common electrode patterns.

13 Claims, 14 Drawing Sheets

(56) References Cited

U.S. PATENT DOCUMENTS

2010/0245224 A1   9/2010  Xu et al.
2010/0271583 A1  10/2010  Ge et al.
2012/0099037 A1*  4/2012  Park .................. G02F 1/13624
                                                         349/33
2012/0327346 A1  12/2012  Tsai et al.

* cited by examiner

PIXEL STRUCTURE

CROSS-REFERENCE TO RELATED APPLICATION

This application claims the priority benefit of China application serial no. 201410441764.4, filed on Sep. 1, 2014. The entirety of the above-mentioned patent application is hereby incorporated by reference herein and made a part of this specification.

BACKGROUND OF THE INVENTION

Field of Invention

The present invention relates to pixel structure. More particularly, the present invention relates to pixel structure, which is involved in a liquid crystal (LC) driving mode with a mix of horizontal electric field and fringe electric field.

Description of Related Art

As the display size of LC display panel is continuously increasing under development, the LC display panel is also developed to have the performance of high contract, fast response, wide viewing angle, and so on, due to request in the market. To overcome the issue of wide viewing angle for the LC display panel in large size, the wide viewing technology for the LC display panel is also necessarily to be continuously developed and breakthrough. The wide viewing technology currently known includes twisted nematic (TN) LC display panel with wide viewing film, in-plane switching (IPS) LC display panel, fringe field switching (FFS) LC display panel, and multi-domain vertical alignment (MVA) LC display panel.

The wide viewing technologies of FFS and IPS LC are even becoming the trend. The storage capacitance (Cst) in the FFS LC display panel is related to the overlapping area between two electrode layers. However, when the panel is developed in large size, the FFS LC display panel would have some issues, due to Cst being over large. For example, the resistance-capacitance (RC) loading on the data line would be over large, resulting in the issue of insufficient charging. In comparison, although the IPS LC display panel would not have the above issue, the LC efficiency of the IPS LC display panel is lower than the FFS LC display panel. In addition, the operation voltage of the IPS LC display panel is higher than that of the FFS LC display panel.

SUMMARY OF THE INVENTION

The invention provides a pixel structure, which can be applied to the display panel and can at least solve the foregoing issues in the FFS LC display panel and the IPS LC display panel.

The pixel structure includes a scan line and a data line, an active device, a pixel electrode and a common electrode. The active device is electrically connected to the scan line and the data line. The pixel electrode is electrically connected to the active device, wherein the pixel electrode includes a plurality of first layer pixel electrode patterns and a plurality of second layer pixel electrode patterns. The common electrode is electrically insulating from the pixel electrode. The common electrode includes a plurality of first layer common electrode patterns and a plurality of second layer common electrode patterns. A fringe electric field is between each of the first layer pixel electrode patterns and the corresponding portion of the second layer common electrode patterns, and between each of first layer common electrode patterns and the corresponding portion of the second layer pixel electrode patterns. A horizontal electric field is between each of the second layer pixel electrode patterns and the adjacent portion of the second layer common electrode patterns.

Another pixel electrode of the invention includes a scan line and a data line, an active device, a pixel electrode and a common electrode. The active device is electrically connected to the scan line and the data line. The pixel electrode is electrically connected to the active device. The pixel electrode includes a plurality of first layer pixel electrode patterns and a plurality of second layer pixel electrode patterns. The common pixel electrode is electrically insulating from the pixel electrode. The common pixel electrode includes a plurality of common pixel electrode patterns. A fringe electric field is between each of the first layer pixel electrode patterns and the corresponding portion of common pixel electrode patterns. A horizontal electric field is between each of the second layer pixel electrode patterns and the adjacent portion of the common electrode patterns.

For the foregoing description, a fringe electric field can be between each of the pixel electrode patterns and the corresponding portion of the common electrode patterns at different film layer. In addition, a horizontal electric field can be between each of the pixel electrode patterns and the adjacent portion of the common electrode patterns at the same film layer. Therefore, according to en embodiment of the invention, the LC driving mode can simultaneously have both the horizontal electric field and the fringe electric field in the same pixel structure. Thereby, under the premise without significantly increasing fabrication cost, the issue of over-large Cst for FFS technology at large size can be reduced but also the issues in IPS technology about LC efficiency lower than that in FFS technology and operation voltage higher than that in FFS technology can be reduced.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
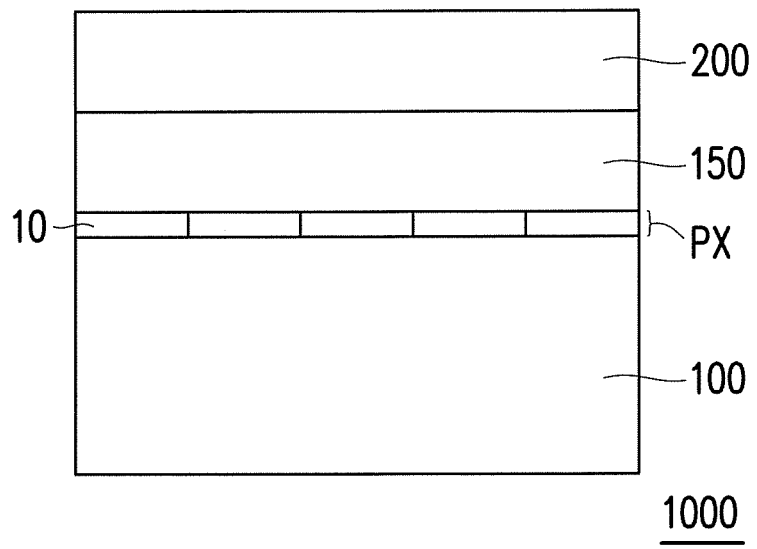
FIG. 1 is a drawing, schematically illustrating a cross-sectional view of a display panel, according to an embodiment of the invention.

FIG. 1 is a drawing, schematically illustrating a cross-sectional view of a display panel, according to an embodiment of the invention. Referring to FIG. 1, a display panel 1000 includes a first substrate 100, a second substrate 200, a display medium 150, and a pixel array layer PX. The display panel 1000 can be LC display panel.

A material of the first substrate 100 can be glass, quartz, organic compound, metal or other like material. The pixel array layer PX is disposed on the first substrate 100. The pixel array layer PX includes multiple pixel structures 10.

The second substrate 200 is opposite to the first substrate 100. A material of the second substrate 200 can be glass, quartz, organic compound, metal or other like material, however, the present invention is just limited to those.

The display medium 150 is located between the pixel array layer PX on the first substrate 100 and the second substrate 200. The display medium 150 includes LC molecules (not shown). The LC molecules can be positive LC molecules or negative LC molecules.

The pixel array layer PX is located on the first substrate 100 and the display medium 150 covers on the pixel array layer PX. The pixel array layer PX has a plurality of pixel structures 10. In the following description, a few of the pixel structures are described according to the embodiments with drawing. To easily describe the embodiments of the invention, only one pixel structure in the pixel array layer PX is drawn.

Figure 2:
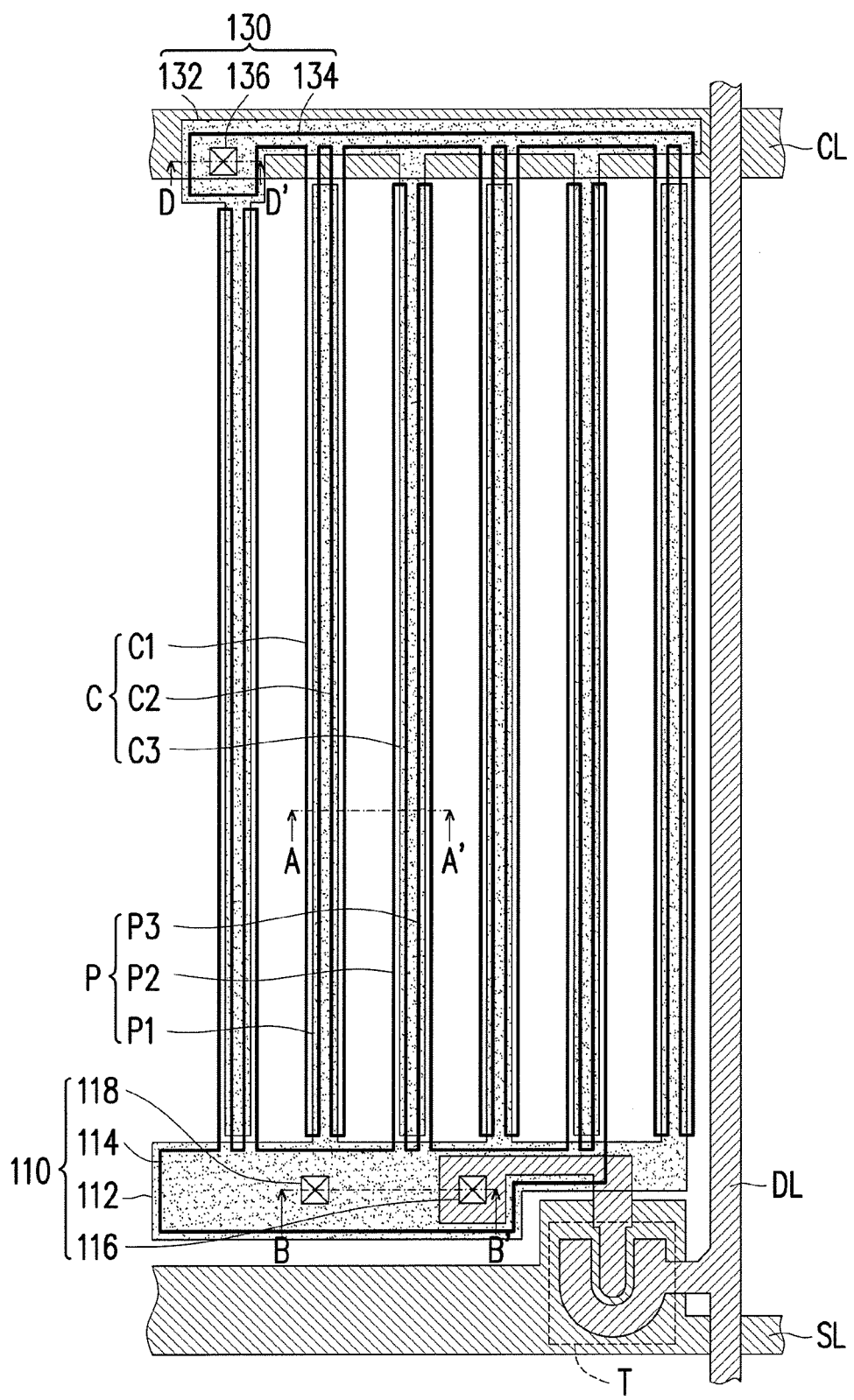
FIG. 2 is a drawing, schematically illustrating a top view of a pixel structure, according to an embodiment of the invention.

FIG. 2 is a drawing, schematically illustrating a top view of a pixel structure, according to an embodiment of the invention. Referring to FIG. 2, the pixel structure 10 shown in FIG. 2 includes a scan line SL, a data line DL, a common electrode line CL, an active device T, a pixel electrode P, and a common electrode C.

As shown in FIG. 2, the extending directions of the scan line SL and the data line DL are different. Preferably, the extending direction of the scan line SL is perpendicular to the extending direction of the data line DL. In addition, the scan line SL and the data line DL are located at different film layer but the scan line SL and the common electrode line CL are located at the same film layer. An insulating layer (not shown) is located between the scan line SL and the data line DL. The scan line SL and the data line DL are mainly used to provide the diving voltage to the pixel electrode P and transmit the driving signal for driving the pixel structure 10. The common electrode line CL mainly is used to provide the common voltage to the common electrode C. The scan line SL, the common electrode line CL and the data line DL are usually made of metallic material, however, the invention is not just limited to that. In another embodiments, the scan line SL, the common electrode line CL and the data line DL can be made of other conductive material, which may include alloy, metal oxide, metal nitride, metal oxynitride, or a stack of metallic material with other conductive material. However, the invention is not just limited to those materials.

The material of the pixel electrode P and the common electrode C can be, for example, transparent conductive layer, which includes metal oxide, such as indium tin oxide (ITO), indium zinc oxide (IZO), aluminum tin oxide (ATO), aluminum zinc oxide (AZO), indium gallium zinc oxide (IGZO), or other available oxide, or a stack of at least two of those materials. However, the invention is not just limited to those.

As shown in FIG. 2, the active device T is electrically connected to the scan line SL and the data line DL. Here, the active device T is thin film transistor as an example, which comprises a gate, a channel, a drain and a source. An insulating layer (not shown) is formed over the gate of the active device T, also referred as gate insulating later (GI). The insulating layer causes that the scan line SL is insulating from the data line DL. The material of the insulating layer can include inorganic material, organic material or a combination thereof, as an example. The inorganic material can include SiO, SiN, SiON, or a stack from at least two of those, as an example. However, the invention is not just limited to those materials.

Figure 3A:
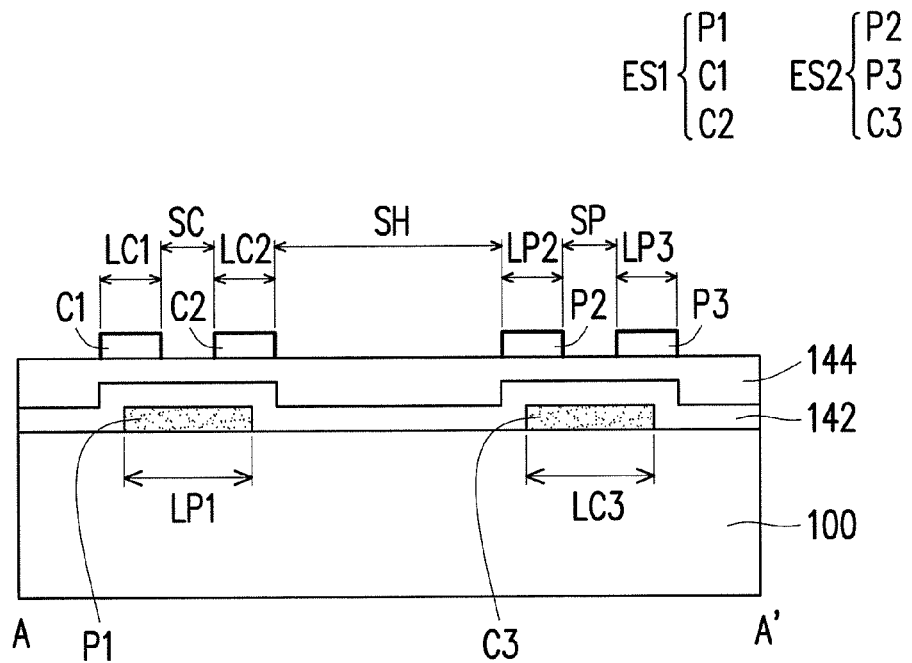
FIG. 3A is a drawing, schematically illustrating a cross-sectional view of the pixel structure, cutting at the line A-A' in FIG. 2.

FIG. 3A is a drawing, schematically illustrating a cross-sectional view of the pixel structure, cutting at the line A-A' in FIG. 2. Referring to FIG. 1 and FIG. 3A, the common electrode C of the pixel structure 10 is electrically insulating from the pixel electrode P. In the embodiment, the pixel electrode P includes a plurality of pixel electrode patterns, P1, P2, and P3. As shown in FIG. 3A, the pixel electrode pattern P1 is directly disposed on the first substrate 100. In the embodiment, the film layer where the pixel electrode pattern P1 is located is defined as the "first layer". The film layer where the pixel electrode patterns P2 and P3 are located is defined as the "second layer". Insulating layers 142 and 144 are sequentially disposed between the pixel electrode patterns P2 and P3 and the pixel electrode pattern P1. In the embodiment, the common electrode C of the pixel structure 10 includes multiple common electrode patterns C1, C2, and C3. As shown in FIG. 3A, the common electrode patterns C1 and C2 and the pixel electrode patterns P2 and P3 are located at the same second layer. The common electrode pattern C3 and the pixel electrode pattern P1 are located at the same first layer. In the embodiment, the first layer pixel electrode pattern P1 and the two second layer common electrode patterns C1 and C2 form a first electrode set of fringe electric field ES1. The first layer common electrode pattern C3 and the second layer pixel electrode patterns P2 and P3 form a second electrode set of fringe electric field. However, the invention is not just limited to those. In other embodiments, the first electrode set of fringe electric field can be formed from the pixel electrode pattern P1 with more second layer common electrode patterns C1, C2. Likewise, the second electrode set of fringe electric field can be formed from common electrode pattern C3 with more second layer pixel electrode patterns P2 and P3.

Referring to FIG. 3A, a line width of the pixel electrode pattern P1 at the first layer is LP1, and a line width of the common electrode pattern C3 at the first layer is LC3. In the embodiment, the line width LP1 and line width LC3 are respectively greater than 0 and less than or equal to 30 In addition, line widths of the second layer pixel electrode patterns P2 and P3 are LP2 and LP3. Line widths of the second layer common electrode patterns C1 and C2 are LC1 and LC2. In the embodiment, the line widths of LP2 and LP3 and the line widths of LC1 and LC2 are respectively greater than 0 and less than or equal to 10 μm, as an example. A gap between the pixel electrode pattern P2 and the adjacent pixel electrode pattern P3 is SP, and a gap between the common electrode pattern C1 and the adjacent common electrode pattern C2 is SC. In the embodiment, the gaps SP and SC are respectively greater than 0 and less than or equal to 20 μm, as an example. In addition, a gap between the pixel electrode pattern P2 and the adjacent common electrode pattern C2 at the same second layer is SH. In the embodiment, the gap SH is greater than 0 and less than or equal to 30 μm, as an example.

Figure 3B:
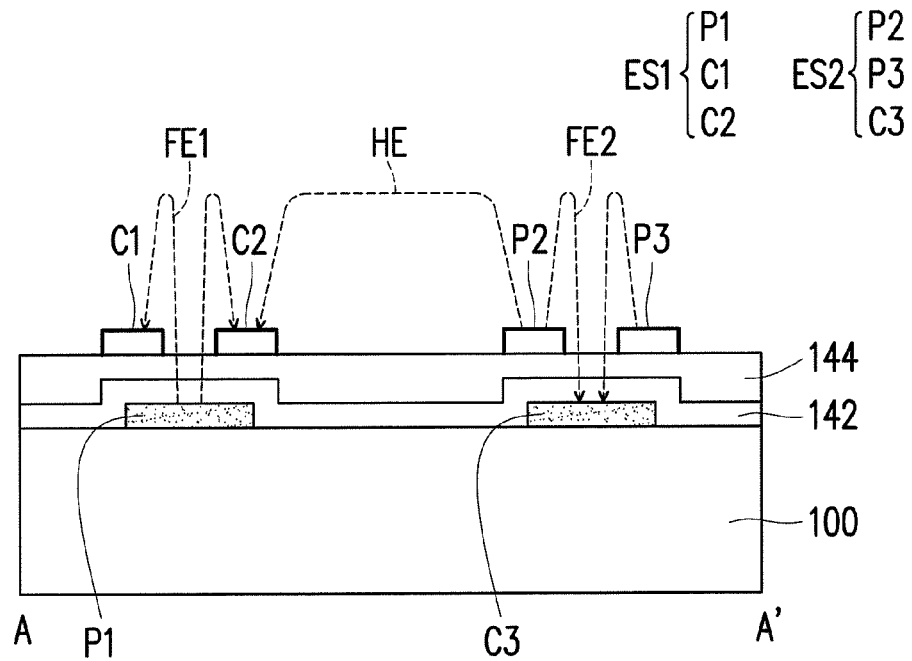
FIG. 3B is a drawing, schematically illustrating the electric field formed in the pixel structure of FIG. 3A.

FIG. 3B is a drawing, schematically illustrating the electric field formed in the pixel structure of FIG. 3A. Referring to FIG. 3B, the pixel structure 10 of the embodiment, a fringe electric field FE1 can be formed between the first layer pixel electrode pattern P1 and the corresponding portion of the second layer common electrode patterns C1 and C2. Likewise, a fringe electric field FE2 can be formed between the first layer common electrode pattern C3 and the corresponding portion of the second layer pixel electrode patterns P2 and P3. Remarkably, a horizontal electric field HE can be additionally formed between the second layer pixel electrode pattern P2 and the adjacent second layer common electrode pattern C2. In other words, the horizontal electric field HE can be formed between the first electrode set of fringe electric field and the second electrode set of fringe electric field. In the pixel structure 10 of the embodiment, multiple fringe electric fields FE1 and FE2 can be formed but also multiple horizontal electric field HE can be formed in the same pixel structure 10, in which only one horizontal electric field HE is shown for easy description.

It can be noted in the embodiment that the number of the first layer electrode patterns and the number of the second layer electrode patterns are designed to be a ratio of 1 to 2. The number of the fringe electric field FE1 (or FE2) and the number of the horizontal electric field HE formed in the same pixel structure 10 can be a ratio of 1 to 1. The horizontal electric field HE can be formed adjacent to the second pixel layer, being close to the LC molecules. However, the invention is not just limited to this manner. In other embodiments, the ratio of the numbers of the first layer electrode patterns and the second layer electrode patterns can be changed, so as to adjust the forming locations and the ratio of the numbers for the fringe electric field EF1 (or EF2) and the horizontal electric field HE. For example, the number of the first layer electrode patterns and the number of the second layer electrode patterns can be designed to be 2 to 1, so that The number of the fringe electric field FE1 (or FE2) and the number of the horizontal electric field HE can be a ratio of 1 to 1. The horizontal electric field HE can be formed adjacent to the second pixel layer, being far away the LC molecules. As a result, under the premise without significantly increasing fabrication cost, the display panel 1000 composed from the pixel structure 10 in the embodiment can have relatively low driving voltage and be good in LC response and aperture ratio.

Figure 4:
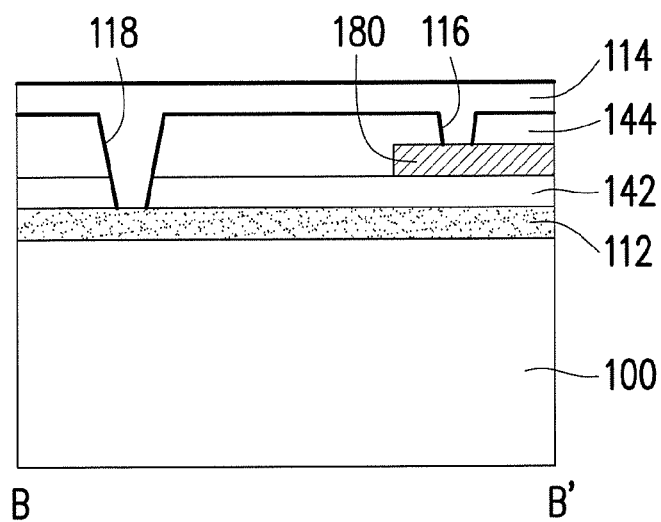
FIG. 4 is a drawing, schematically illustrating a cross-sectional view of the pixel structure, cutting at the line B-B' in FIG. 2.

FIG. 4 is a drawing, schematically illustrating a cross-sectional view of the pixel structure, cutting at the line B-B' in FIG. 2. Referring to FIG. 4, in the embodiment, the pixel electrode P further includes an interconnection structure of pixel electrode 110 but the invention is not limited to that. The interconnection structure of pixel electrode 110 includes a first layer interconnection 112, a second layer interconnection 114, a first contact window 116 and a second contact window 118. As shown in FIG. 2, the first layer interconnection 112 connects to the first layer pixel electrode pattern P1, the second layer interconnection 114 connects to the second layer pixel electrode patterns P2 and P3. The pixel electrode P and the active device T are electrically connected. In the embodiment, the second layer pixel electrode patterns P2 and P3 and the first layer pixel electrode pattern P1 are electrically connected to the interconnection structure of pixel electrode 110. In better detail, referring to FIG. 4, the first contact window 116 electrically connects the conductive layer 180, in which the conductive layer 180 is the drain of the active device T, and the second layer interconnection 114, and the second contact window 118 electrically connects the first layer interconnection 112 and the second layer interconnection 114.

Figure 5:
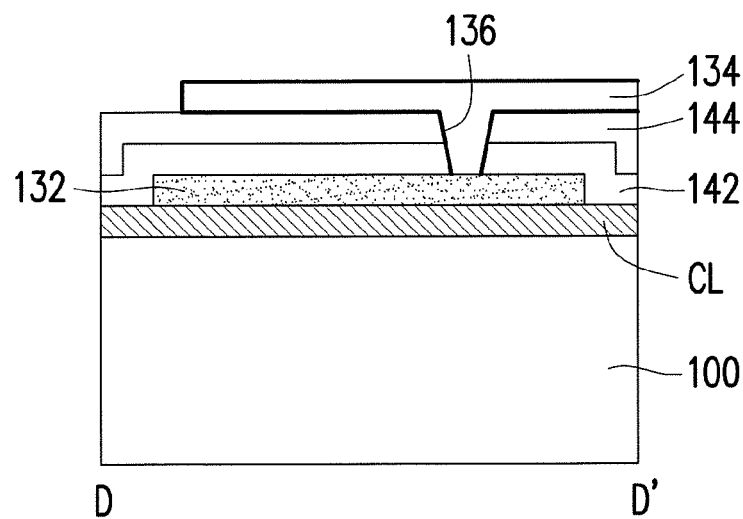
FIG. 5 is a drawing, schematically illustrating a cross-sectional view of the pixel structure, cutting at the line D-D' in FIG. 2.

FIG. 5 is a drawing, schematically illustrating a cross-sectional view of the pixel structure, cutting at the line D-D' in FIG. 2. In the embodiment, the common electrode C further comprises an interconnection structure of common electrode 130, but the invention is not limited to that. The interconnection structure of common electrode 130 includes a first layer interconnection 132, a second layer interconnection 134 and a contact window 136. In the embodiment, the second layer common electrode patterns C1 and C2 and the first layer common electrode pattern C3 are electrically connected to the interconnection structure of common electrode 130. The interconnection structure of common electrode 130 is electrically connected to the common electrode line CL. As shown in FIG. 2, the first layer interconnection 132 is connected to the first layer common electrode pattern C3 and the second layer interconnection 134 is connected to the second layer common electrode patterns C1 and C2.

In the embodiment, as shown in FIG. 5, the first layer interconnection 132 directly contact the common electrode line CL but the invention is not limited to that. In other embodiments, an insulating layer can be formed between the first layer interconnection 132 and the common electrode line CL, and the first layer interconnection 132 is electrically connected with the common electrode line CL by a via structure. In addition, insulating layers 142, 144 are formed between the second layer interconnection 134 and the first layer interconnection 132. The second layer interconnection 134 and the first layer interconnection 132 are electrically connected by the contact window 136. Materials of the insulating layer 142, 144 can include inorganic material, organic material, or a combination of both, as an example. The inorganic material may include silicon oxide, silicon nitride, silicon oxynitride, a stack of at least two of those, but the invention is not limited to that.

In the embodiment, as shown in FIG. 2, the pixel electrode patterns P1, P2, and P3 and the common electrode patterns C1, C2, and C3 are line patterns. However, the invention is not limited to that. In other embodiments, the pixel electrode patterns P1, P2, and P3 and the common electrode patterns C1, C2, and C3 can be other geometric shape or patterns. In addition, in the embodiment, the pixel electrode patterns P1, P2, and P3 and the common electrode patterns C1, C2, and C3 are respectively parallel with the data line DL but the invention is not limited to that.

Figure 6:
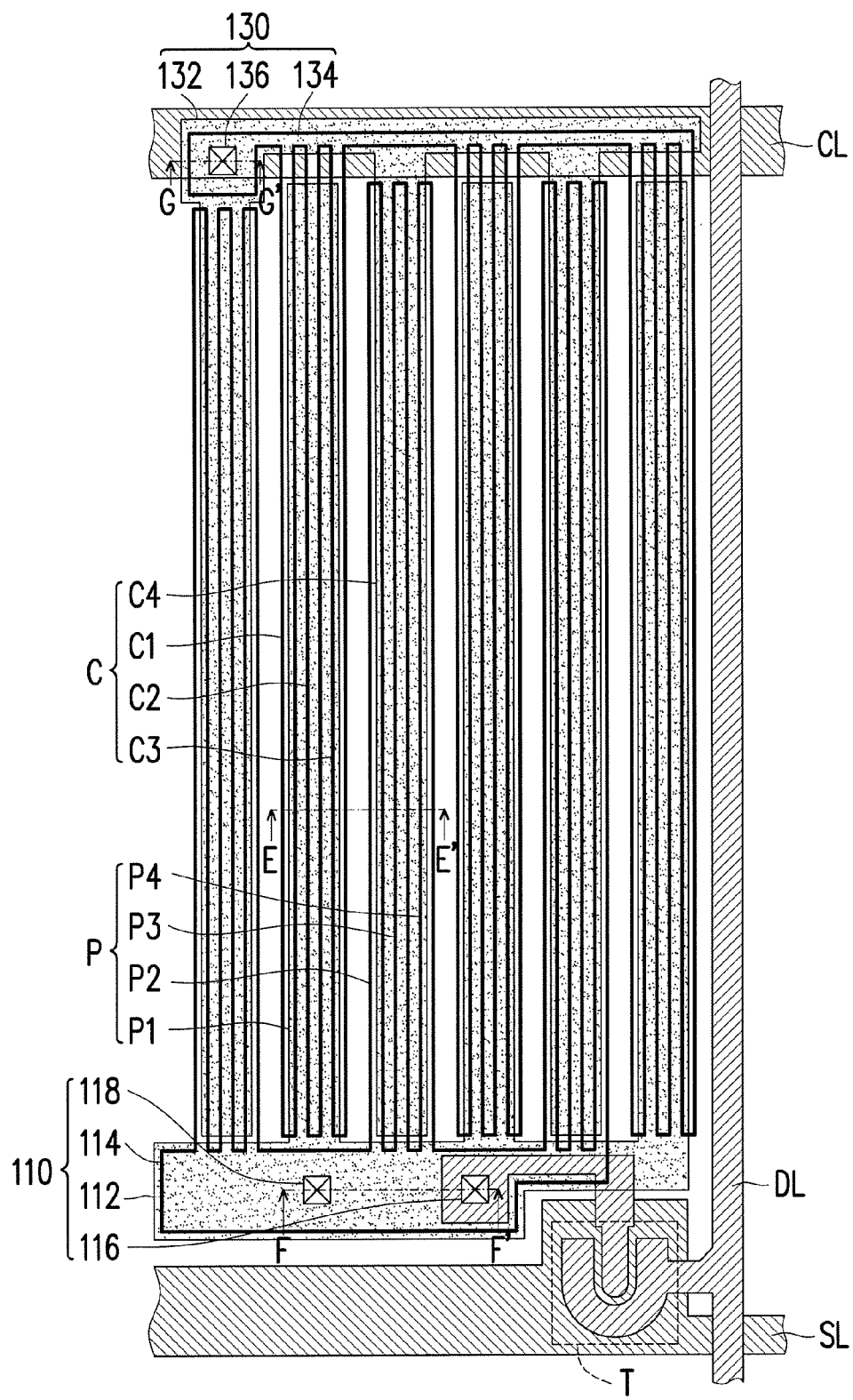
FIG. 6 is a drawing, schematically illustrating a top view of a pixel structure, according to another embodiment of the invention.

FIG. 6 is a drawing, schematically illustrating a top view of a pixel structure, according to another embodiment of the invention. Referring to FIG. 6, the pixel structure 20 shown in FIG. 6, includes a scan line SL, a data line DL, a common electrode line CL, an active device T, a pixel electrode P and a common electrode C. The same or similar device reference numerals are used without further descriptions for those device elements of the pixel structure 20 shown in FIG. 6, which are same or similar the device elements of the pixel structure 10 shown in FIG. 2.

Figure 7A:
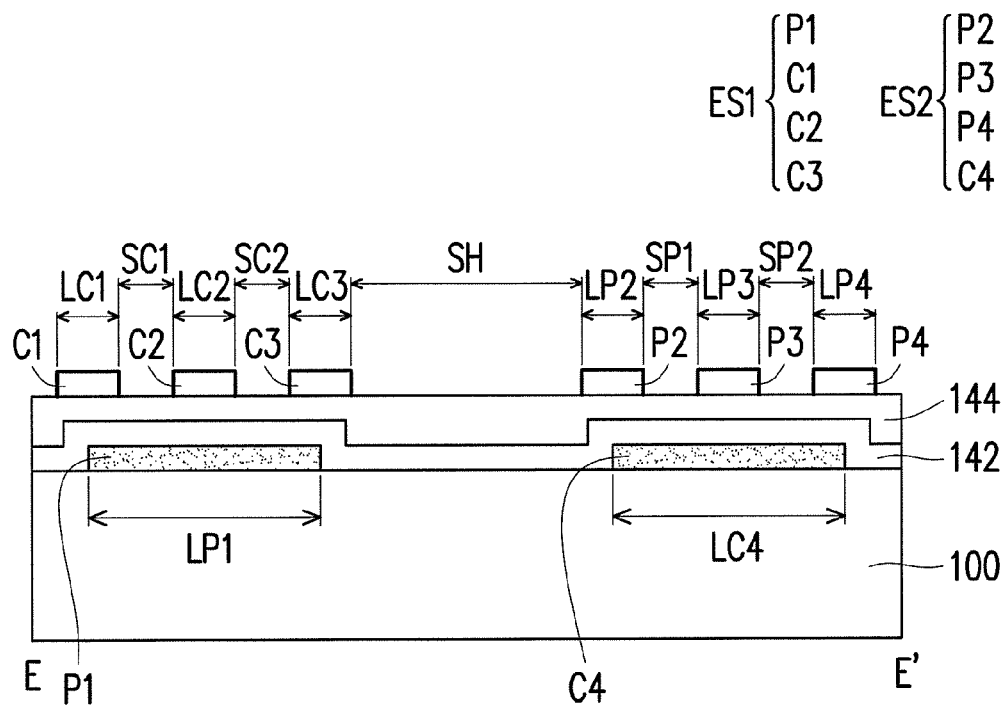
FIG. 7A is a drawing, schematically illustrating a cross-sectional view of the pixel structure, cutting at the line E-E' in FIG. 6.

FIG. 7A is a drawing, schematically illustrating a cross-sectional view of the pixel structure, cutting at the line E-E' in FIG. 6. Referring to FIG. 6 and FIG. 7A, the difference of the pixel structure 20 from the pixel structure 10 in FIG. 2 is the number of patterns and the implementation for the pixel electrode P and the common electrode C. In detail, the pixel electrode P of the pixel structure 20 includes multiple pixel electrode patterns P1, P2, P3, and P4. As shown in FIG. 7A, the pixel electrode pattern P1 is directly implemented on the first substrate 100. Likewise, in the embodiment, the film layer where the pixel electrode pattern P1 is located is defined as "first layer". The film layer, where the pixel electrode patterns P2, P3, and P4 are located, is defined as "second layer". Insulating layers are sequentially implemented between the pixel electrode patterns P2, P3, and P4 and the pixel electrode pattern P1. In the embodiment, the common electrode C of the pixel structure 20 includes multiple common electrode patterns C1, C2, C3, and C4. As shown in FIG. 7A, the common electrode patterns C1, C2, C3 and the pixel electrode patterns P2, P3, P4 are located at the same second layer. The common electrode pattern C4 and the pixel electrode pattern P1 are located at the same first layer. Remarkably, in the embodiment, the first layer pixel electrode pattern P1 and the three of the second layer common electrode patterns C1, C2, C3 form a first electrode set of fringe electric field ES1. The common electrode pattern C4 and the three of pixel electrode patterns P2, P3, P4 form a second electrode set of fringe electric field ES2.

Referring to FIG. 7A, a line width of the first layer pixel electrode pattern P1 is LP1. A line width of the first layer common electrode pattern C4 is LC4. In the embodiment, the line width LP1 and the line width LC4 are respectively greater than 0 and less than or equal to 50 µm. In addition, line widths of the second layer pixel electrode patterns P2, P3 and P4 are LP2, LP3, and LP4. The line widths of the second layer common electrode patterns C1, C2, and C3 are LC1, LC2, and LC3. In the embodiment, the line widths LP2, LP3, and LP4 and the line widths LC1, LC2, and LC3 are respectively greater than 0 and less than or equal to 10 µm. The gaps SP1 and SP2 are existing between the pixel electrode pattern P3 and respectively the adjacent pixel electrode patterns P2 and P4. The gaps SC1 and SC2 are existing between the common electrode pattern C2 and respectively the adjacent common electrode patterns C1 and C3. In the embodiment, the gaps SP1 and SP2 and the gaps SC1 and SC2 are respectively greater than 0 and less than or equal to 20 µm, as an example. In addition, a gap SH is between the pixel electrode pattern P2 and adjacent common electrode pattern C2 at the same second layer. In the embodiment, the gap SH is greater than 0 and less than or equal to 30 µm, as an example.

Figure 7B:
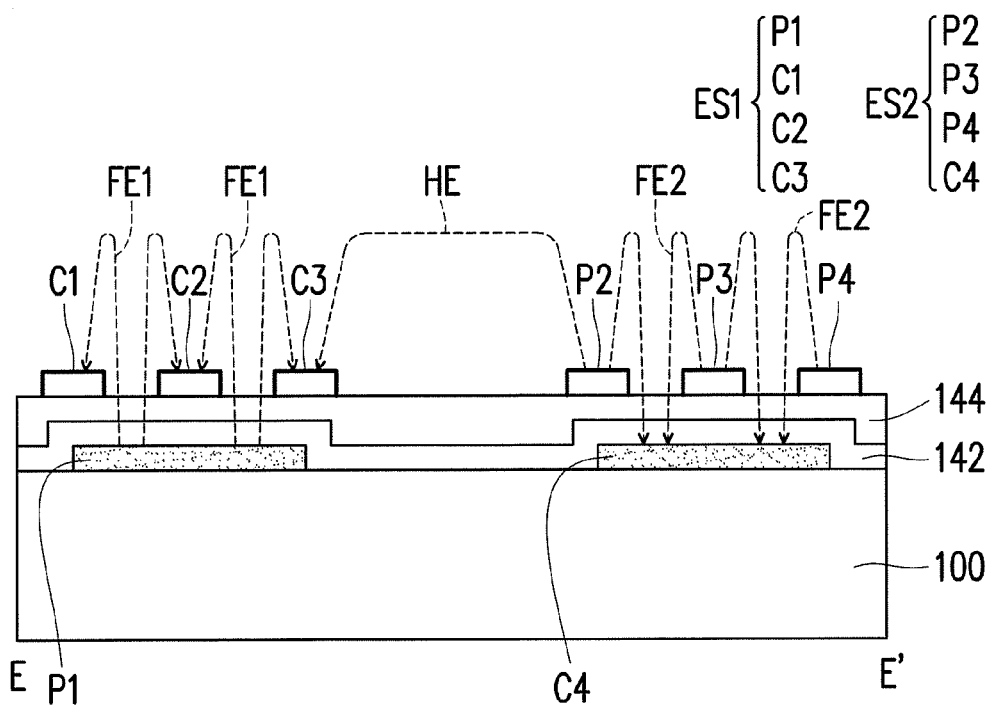
FIG. 7B is a drawing, schematically illustrating the electric field formed in the pixel structure of FIG. 7A.

FIG. 7B is a drawing, schematically illustrating the electric field formed in the pixel structure of FIG. 7A. Referring to FIG. 7B, in the pixel structure 20 of the embodiment, two fringe electric fields FE1 can be formed between the first layer pixel electrode pattern P1 and the second layer common electrode patterns C1, C2, C3. Likewise, two fringe electric fields FE2 can also be formed between the first layer common electrode pattern C4 and corresponding second layer pixel electrode patterns P2, P3, P4. Remarkably, a horizontal electric field HE can also be formed between the second layer pixel electrode pattern P2 and the adjacent second layer common electrode pattern C3, that is, between the first electrode set of fringe electric field and the second electrode set of fringe electric field.

In comparison with the pixel structure 10, in the embodiment, the number of the first layer electrode patterns and the number of the second layer electrode patterns in the pixel structure 20 is designed to be a ratio of 1 to 3. As a result, the number of the fringe electric field FE1 (or FE2) and the number of the horizontal electric field HE in the same pixel structure 20 can be a ratio of 2 to 1. The horizontal electric field HE can be adjacent to the second electrode layer, closing to the LC molecules but the invention is not limited to that. In other embodiments, the ratio of the number of the first layer electrode patterns to the number of the second layer electrode patterns can be changed, so as to adjust the implementation location and the number ratio of the fringe electric fields FE1 (or FE2) and the horizontal electric fields HE. For example, the number of the first layer electrode patterns and the number of the second layer electrode patterns can be designed to be a ratio of 3 to 1, then the number of the fringe electric field FE1 (or FE2) and the number of the horizontal electric field HE can be a ratio of 2 to 1. The horizontal electric field HE can be adjacent to the first electrode layer, far away from the LC molecules. As a result, under the premise without significantly increasing fabrication cost, the display panel 1000 composed from the pixel structure 20 in the embodiment can have relatively low driving voltage and be good in LC response and aperture ratio.

Figure 8:
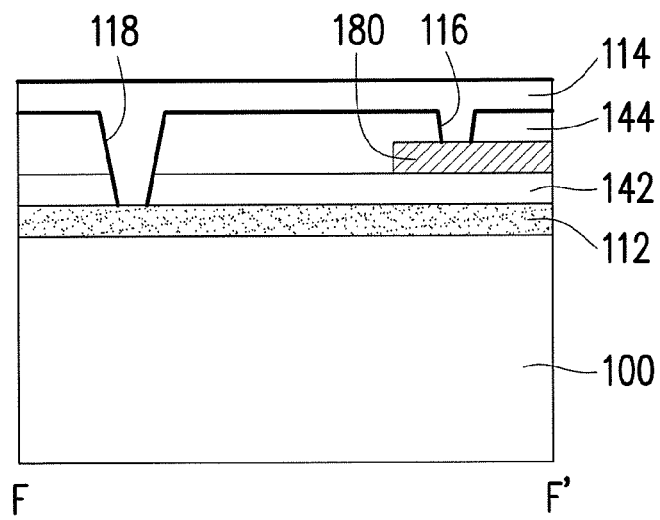
FIG. 8 is a drawing, schematically illustrating a cross-sectional view of the pixel structure, cutting at the line F-F' in FIG. 6.

FIG. 8 is a drawing, schematically illustrating a cross-sectional view of the pixel structure, cutting at the line F-F' in FIG. 6. FIG. 8 is similar to FIG. 4, and the like device elements are indicated by the like reference numerals without further descriptions. In the embodiment, the pixel electrode P in the pixel structure 20 further includes an interconnection structure of pixel electrode 110. Likewise, the interconnection structure of pixel electrode 110 includes a first layer interconnection 112, a second layer interconnection 114, a first contact window 116 and a second contact window 118. As shown in FIG. 6, the first layer interconnection 112 connects to the first layer pixel electrode pattern P1, the second layer interconnection 114 connects to the second layer pixel electrode patterns P2, P3, and P4. The pixel electrode P and the active device T are electrically connected. In the embodiment, the second layer pixel electrode patterns P2, P3 and P4 and the first layer pixel electrode pattern P1 are electrically connected to the interconnection structure of pixel electrode 110. The active device T and the interconnection structure of pixel electrode 110 are electric connected.

Figure 9:
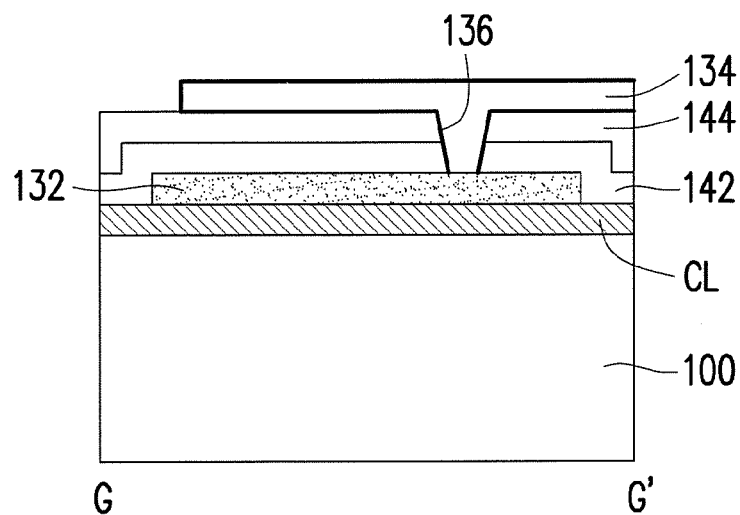
FIG. 9 is a drawing, schematically illustrating a cross-sectional view of the pixel structure, cutting at the line G-G' in FIG. 6.

FIG. 9 is a drawing, schematically illustrating a cross-sectional view of the pixel structure, cutting at the line G-G' in FIG. 6. FIG. 9 is similar to FIG. 5, and the like device elements are indicated by the like reference numerals without further descriptions. In the embodiment, the common electrode C further comprises an interconnection structure of common electrode 130. The interconnection structure of common electrode 130 includes a first layer interconnection 132, a second layer interconnection 134 and a contact window 136. In the embodiment, the second layer common electrode patterns C1, C2 and C3 and the first layer common electrode pattern C4 are electrically connected to the interconnection structure of common electrode 130. The interconnection structure of common electrode 130 is electrically connected to the common electrode line CL. As shown in FIG. 2, the first layer interconnection 132 is connected to the first layer common electrode pattern C3 and the second layer interconnection 134 is connected to the second layer common electrode patterns C1, C2, and C3.

Figure 10:
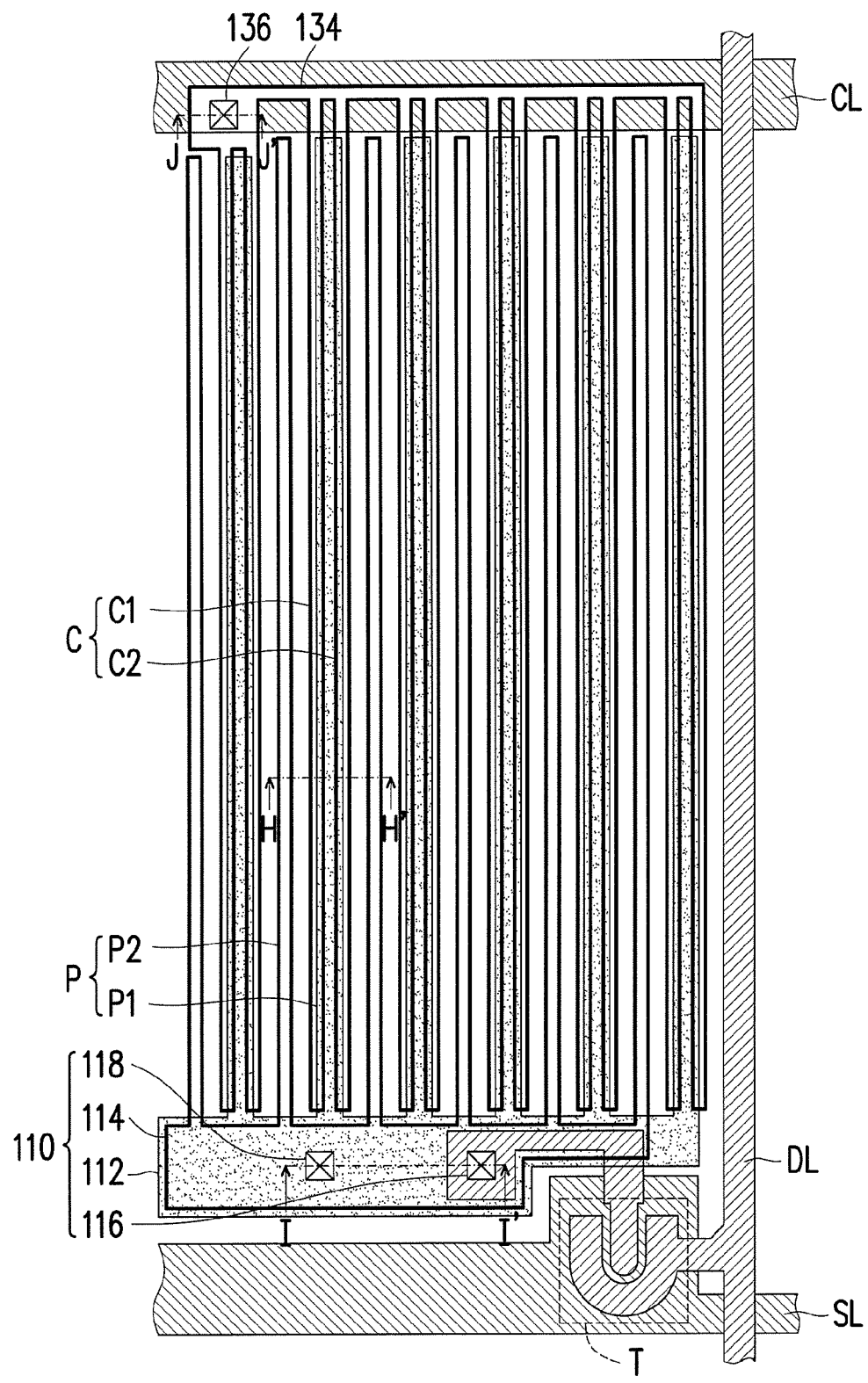
FIG. 10 is a drawing, schematically illustrating a top view of a pixel structure, according to another embodiment of the invention.

FIG. 10 is a drawing, schematically illustrating a top view of a pixel structure, according to another embodiment of the invention. Referring to FIG. 10, the pixel structure 30 shown in FIG. 10, includes a scan line SL, a data line DL, a common electrode line CL, an active device T, a pixel electrode P and a common electrode C. The same or similar device reference numerals are used without further descriptions for those device elements of the pixel structure 30 shown in FIG. 10, which are same or similar the device elements of the pixel structure 10 shown in FIG. 2.

Figure 11A:
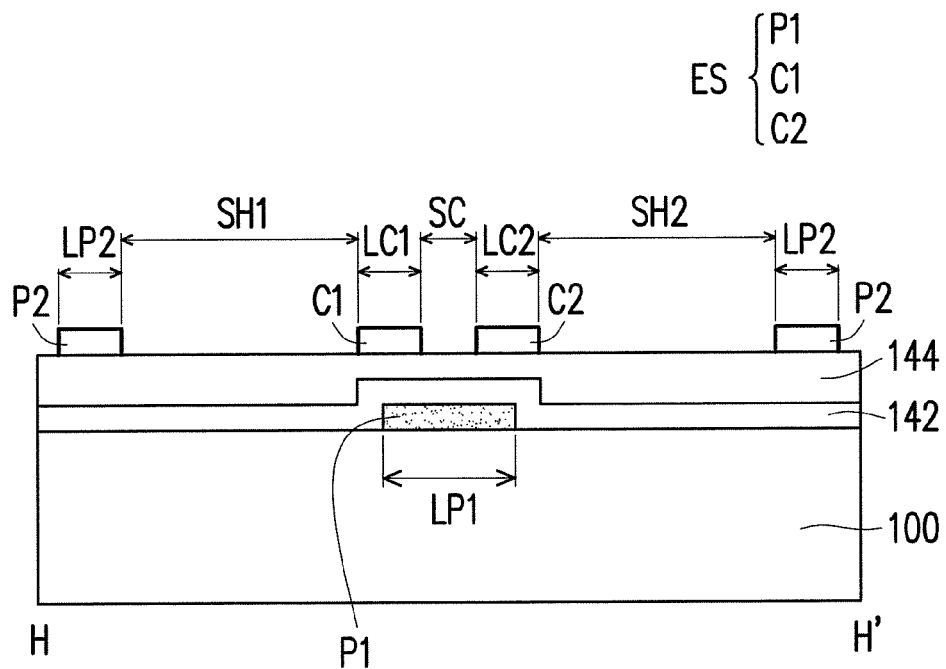
FIG. 11A is a drawing, schematically illustrating a cross-sectional view of the pixel structure, cutting at the line H-H' in FIG. 10.

FIG. 11A is a drawing, schematically illustrating a cross-sectional view of the pixel structure, cutting at the line H-H' in FIG. 10. Referring to FIG. 10 and FIG. 11A, the difference of the pixel structure 30 from the pixel structure 10 in FIG. 2 is the number of patterns and the implementation for the pixel electrode P and the common electrode C. In detail, the pixel electrode P of the pixel structure 30 includes multiple first layer pixel electrode patterns P1 and second layer pixel electrode patterns P2. As shown in FIG. 11A, the first layer pixel electrode patterns P1 are directly implemented on the first substrate 100. Likewise, the insulating layers 142 and 144 are sequentially implemented between the second layer pixel electrode patterns P2 and the first layer pixel electrode patterns P1. Remarkably, in the embodiment, the common electrode C of the pixel structure 30 includes multiple common electrode patterns C1, C2 at the same film layer. As shown in FIG. 11A, the common electrode patterns C1, C2 and the second layer pixel electrode patterns P2 are located at the film layer. Likewise, in the embodiment, the first layer pixel electrode pattern P1 and two common electrode patterns C1 and C2 form an electrode set of fringe electric field ES.

Referring to FIG. 11A, a line width of the first layer pixel electrode pattern P1 is LP1. In the embodiment, the line width LP1 is greater than 0 and less than or equal to 30 μm, as an example. In addition, a line width of the second layer pixel electrode pattern P2 is LP2. The line widths of the common electrode patterns C1 and C2 at the second layer are LC1 and LC2. In the embodiment, the line width LP2 and the line widths LC1 and LC2 are respectively greater than 0 and less than or equal to 10 μm, as an example. In addition, the second layer pixel electrode patterns P2 are respectively distant from the adjacent second layer common electrode patterns C1 and C2 by the gaps SH1 and SH2. In the embodiment, the gaps SH1 and SH2 are greater than 0 and less than or equal to 30 μm, as an example. A gap between the common electrode pattern C1 and the adjacent common electrode pattern C2 is SC. In the embodiment, the gap SC is greater than 0 and less than or equal to 20 μm, as an example.

Figure 11B:
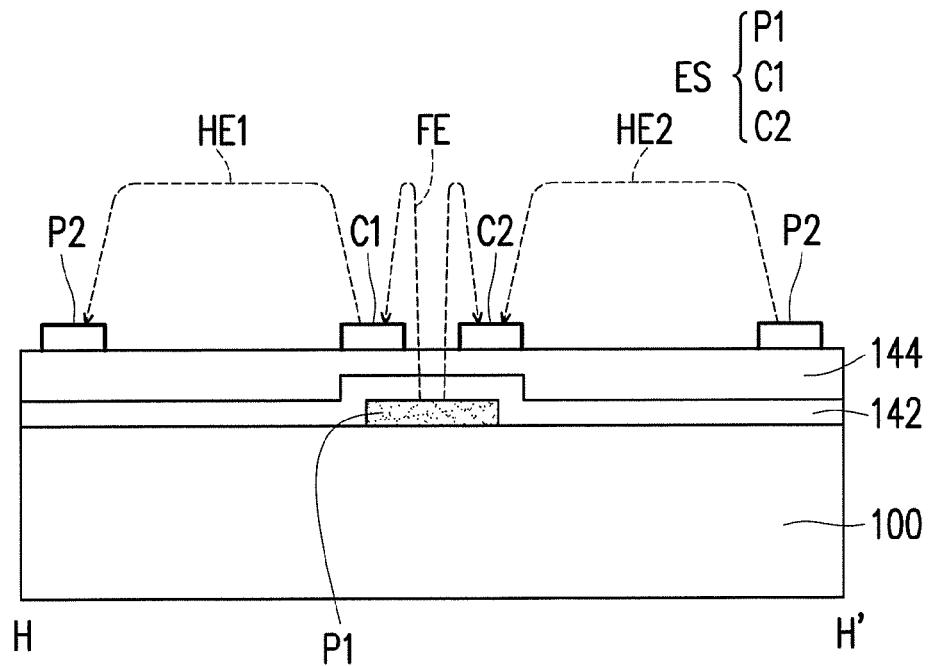
FIG. 11B is a drawing, schematically illustrating the electric field formed in the pixel structure of FIG. 11A.

FIG. 11B is a drawing, schematically illustrating the electric field formed in the pixel structure of FIG. 11A. Referring to FIG. 11B, in the pixel structure of the embodiment, a fringe electric field FE can be formed between the first layer pixel electrode patterns P1 and the corresponding second layer common electrode patterns C1 and C2. Remarkably, two horizontal electric fields HE1, HE2 can also be formed between the electrode set of fringe electric field ES and the two second layer pixel electrode patterns P2 at both sides, that is, between the second layer pixel electrode patterns P2 and respectively the second layer common electrode patterns C1 and C2.

In comparison with pixel structure 10, in the embodiment, the common electrode patterns C1 and C2 are located at the second layer in design. The number of the fringe electric field FE and the number of the horizontal electric fields HE1, HE2 in the same pixel structure 30 can be a ratio of 1 to 2. The horizontal electric fields HE1, HE2 are formed adjacent to the second electrode layer, closing to the LC molecules but the invention is not limited to that. In other embodiments, the common electrode patterns C1 and C2 are located at the first layer in design. As a result, the horizontal electric fields HE1, HE2 can be formed adjacent to the first electrode layer, far away from the LC molecules. Thus, under the premise without significantly increasing fabrication cost, the display panel 1000 composed from the pixel structure 30 in the embodiment can have relatively low driving voltage and be good in LC response and aperture ratio.

Figure 12:
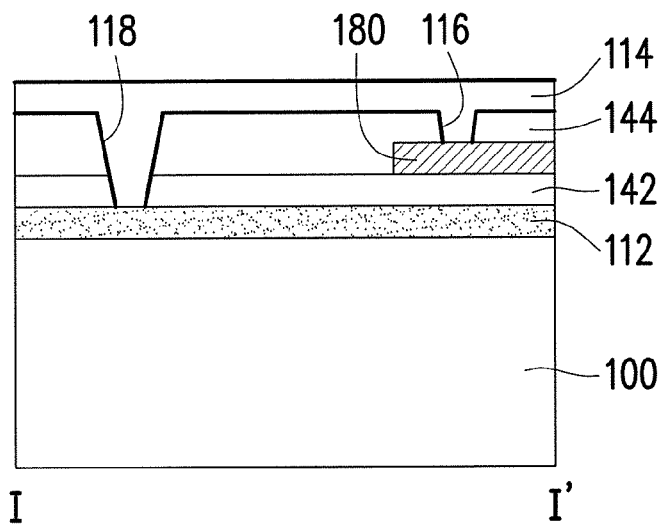
FIG. 12 is a drawing, schematically illustrating a cross-sectional view of the pixel structure, cutting at the line I-I' in FIG. 10.

FIG. 12 is a drawing, schematically illustrating a cross-sectional view of the pixel structure, cutting at the line I-I' in FIG. 10. FIG. 12 is similar to FIG. 4, and the like device elements are indicated by the like reference numerals without further descriptions. In the embodiment, the pixel electrode P in the pixel structure 30 further includes an interconnection structure of pixel electrode 110. Likewise, the interconnection structure of pixel electrode 110 includes a first layer interconnection 112, a second layer interconnection 114, a first contact window 116 and a second contact window 118. As shown in FIG. 12, the first layer interconnection 112 connects to the first layer pixel electrode pattern P1, the second layer interconnection 114 connects to the second layer pixel electrode pattern P2. The pixel electrode P and the active device T are electrically connected. In the embodiment, the second layer pixel electrode pattern P2 and the first layer pixel electrode pattern P1 are electrically connected to the interconnection structure of pixel electrode 110. The active device T and the interconnection structure of pixel electrode 110 are electric connected.

Figure 13:
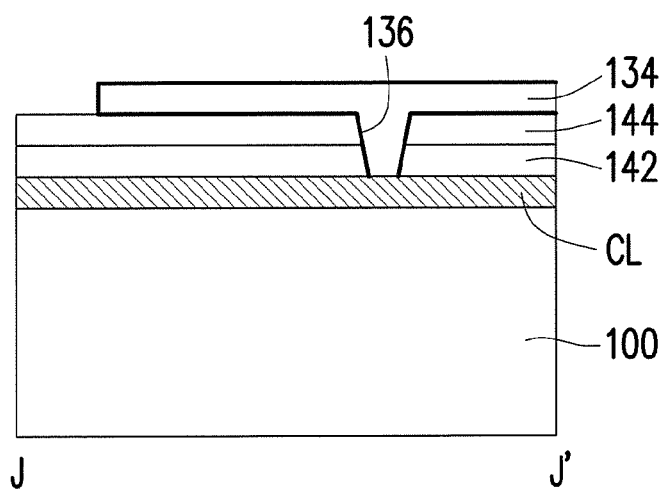
FIG. 13 is a drawing, schematically illustrating a cross-sectional view of the pixel structure, cutting at the line J-J' in FIG. 10.

FIG. 13 is a drawing, schematically illustrating a cross-sectional view of the pixel structure, cutting at the line J-J' in FIG. 10. FIG. 13 is similar to FIG. 5, and the like device elements are indicated by the like reference numerals without further descriptions. In the embodiment, the common electrode C further comprises an interconnection structure of common electrode 130. The interconnection structure of common electrode 130 includes a first layer interconnection 132, a second layer interconnection 134 and a contact window 136. In the embodiment, the common electrode patterns C1, C2 are electrically connected to the interconnection structure of common electrode 130. As shown in FIG. 13, the second layer interconnection 134 is connected to the common electrode line by the contact window 136.

Figure 14:
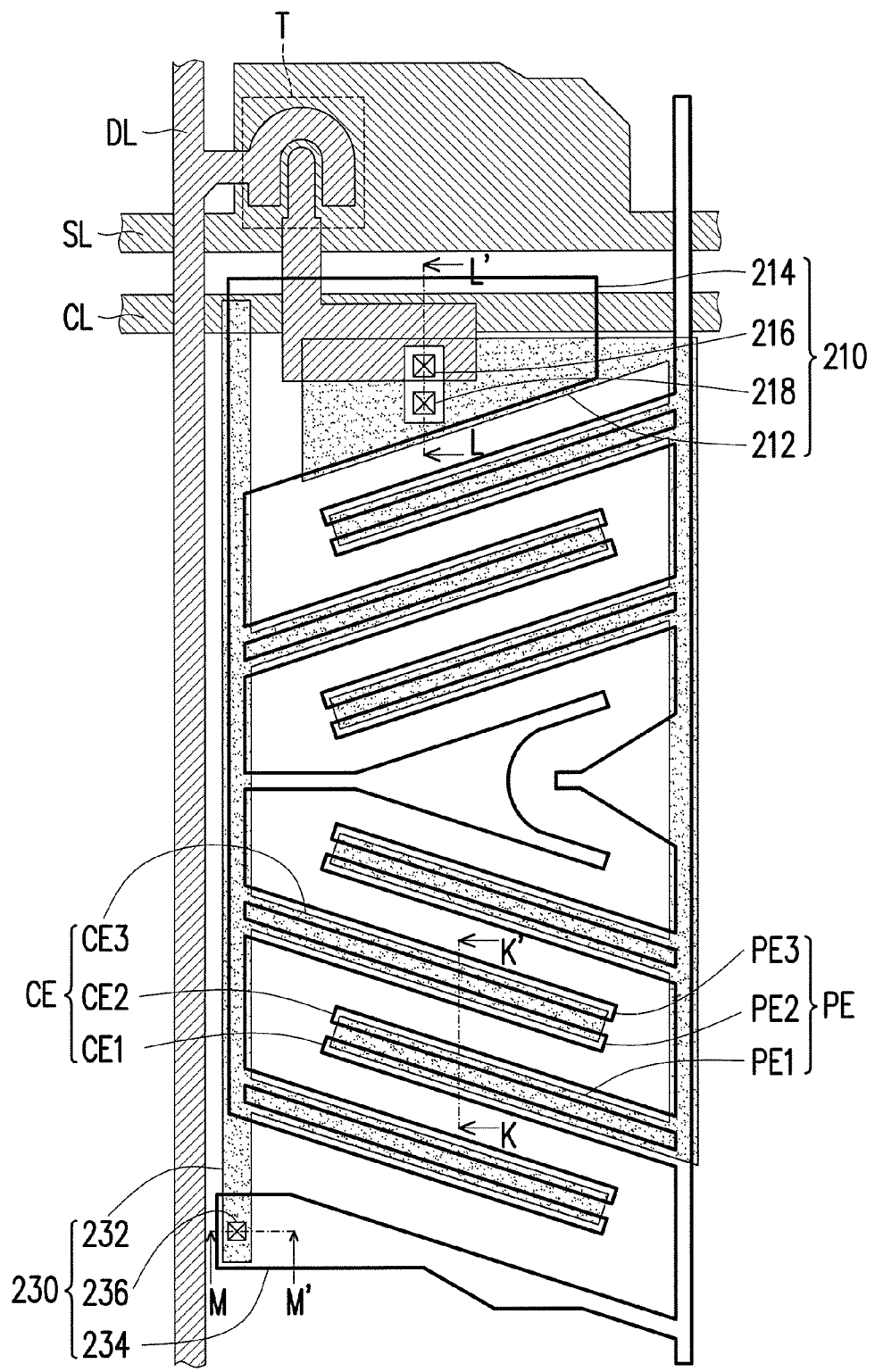
FIG. 14 is a drawing, schematically illustrating a top view of a pixel structure, according to further another embodiment of the invention.

FIG. 14 is a drawing, schematically illustrating a top view of a pixel structure, according to further another embodiment of the invention. Referring to FIG. 14, the pixel structure 40 in FIG. 14 includes a scan line SL, a data line DL, a common electrode line CL, an active device T, a pixel electrode PE and a common electrode CE. The pixel structure 40 in FIG. 14 is similar to the pixel structure 10 in FIG. 2, and the like device elements are indicated by the like reference numerals without repeat descriptions. Referring to FIG. 2 and FIG. 14, the difference between the pixel structure 40 and the pixel structure 10 in FIG. 2 is the implementation of the electrode patterns for the pixel electrode PE and the common electrode CE. In the embodiment, the pixel electrode PE and the common electrode CE of the pixel structure 40 are implemented by a pattern of "=". The pixel electrode patterns PE1, PE2, PE3 and the common electrode patterns CE1, CE2, CE3 are not parallel with the data line DL but the invention is not limited to that. In other embodiments, the pixel structure can have implementation with other electrode patterns.

Figure 15A:
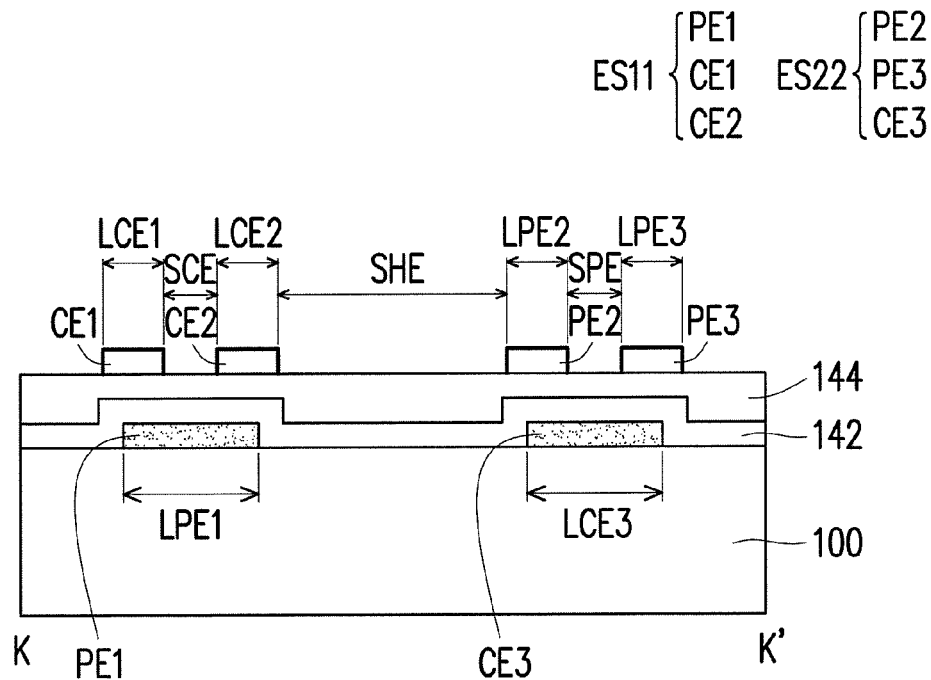
FIG. 15A is a drawing, schematically illustrating a cross-sectional view of the pixel structure, cutting at the line K-K' in FIG. 14.

FIG. 15A is a drawing, schematically illustrating a cross-sectional view of the pixel structure, cutting at the line K-K' in FIG. 14. Referring to FIG. 14 and FIG. 15A, the pixel electrode PE of the pixel structure 40 includes multiple patterns of first layer pixel electrode pattern PE1 and second layer pixel electrode patterns PE2, PE3. As shown in FIG. 15A, the first layer pixel electrode patterns PE1 are directly implemented on the first substrate 100. Likewise, the insulating layers 142, 144 are sequentially implemented between the second layer pixel electrode patterns PE2, PE3 and the first layer pixel electrode patterns PE1. In the embodiment, the common electrode CE of the pixel structure 40 includes multiple common electrode patterns CE1, CE2, CE3. As shown in FIG. 15A, the common electrode patterns CE1, CE2 and the pixel electrode patterns PE2, PE3 are located at the second layer. The common electrode pattern CE3 and the pixel electrode pattern PE1 are located at the first layer. Likewise, in the embodiment, the first layer pixel electrode pattern PE1 and the two second layer common electrode patterns CE1, CE2 form as a first electrode set of fringe electric field ES11. The first layer common electrode pattern CE3 and the two second layer pixel electrode patterns PE2, PE3 form as a second electrode set of fringe electric field ES22. The invention is not limited to those, in the other embodiment, the first electrode set of fringe electric field ES11 can be formed from the pixel electrode pattern PE1 and more second layer common electrode patterns CE1, CE2. Likewise, The second electrode set of fringe electric field ES22 can be formed from the common electrode pattern CE3 and more second layer pixel electrode patterns PE2, PE3.

Referring to FIG. 15A, a line width of the first layer pixel electrode pattern PE1 is LPE1, a line width of the first layer common electrode pattern CE3 is LCE3. In the embodiment, the line widths LPE1 and LCE3 are greater than 0 and less than or equal to 30 µm, as an example. In addition, the line widths of the second layer pixel electrode patterns PE2, PE3 are LPE2 and LPE3, and the line widths of the second layer common electrode patterns CE1 and CE2 are LCE1 and LCE2. In the embodiment, the line widths LPE2 and LPE3 and line widths LCE1 and LCE2 are respectively greater than 0 and less than or equal to 10 µm, as an example. The second layer pixel electrode pattern PE2 is distant from the adjacent second layer pixel electrode pattern PE3 by a gap SPE. The second layer common electrode pattern CE1 is distant from the adjacent second layer common electrode pattern CE2 by a gap SCE. In the embodiment, the gap SPE and the gap SCE are greater than 0 and less than or equal to 20 µm, as an example. In addition, the second layer pixel electrode pattern PE2 is distant from the adjacent second layer common electrode pattern CE2 by a gap SHE. In the embodiment, the gap SHE is greater than 0 and less than or equal to 30 µm, as an example.

Figure 15B:
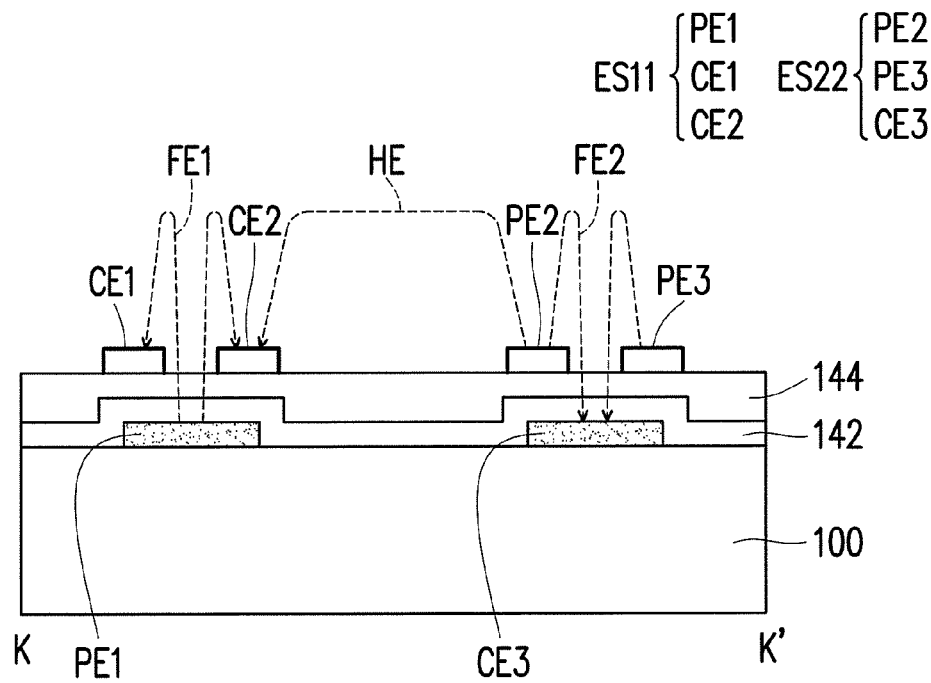
FIG. 15B is a drawing, schematically illustrating the electric field formed in the pixel structure of FIG. 15A.

FIG. 15B is a drawing, schematically illustrating the electric field formed in the pixel structure of FIG. 15A. Referring to FIG. 15B, the pixel structure of the embodiment, a fringe electric field FE1 can be formed between the first layer pixel electrode pattern PE1 and the corresponding second layer common electrode patterns CE1 and CE2. Likewise, a fringe electric field FE2 can be formed between the first layer common electrode pattern CE3 and the corresponding first layer pixel electrode patterns PE2 and PE3. Remarkably, a horizontal electric field HE can also be formed between the second layer pixel electrode pattern PE2 and the adjacent second layer common electrode pattern CE2. In other words, the horizontal electric field HE can be formed between the first electrode set of fringe electric field ES11 and the second electrode set of fringe electric field ES22. In other words, the pixel structure 40 of the embodiment can form multiple fringe electric fields FE1, FE2, but also multiple horizontal electric fields HE can also be formed, in which only one horizontal electric field HE is shown in FIG. 15B for easy description.

Remarkably, in the embodiment, a ratio for the number of the first layer electrode patterns to the number of the second layer electrode patterns is designed to be 1 to 2, so that a ratio for the number of the fringe electric field FE1 (or FE2) to the number of horizontal electric field (HE) in the same pixel structure 40 can be 1 to 1. The horizontal electric field (HE) can be adjacent to the second electrode layer, closing to the LC molecules. However, the invention is not limited to those manners. In another embodiment, the ratio for the number of the first layer electrode patterns to the number of the second layer electrode patterns can be changed, so as to adjust the ratio of the number and the implement locations for the fringe electric field FE1 (or FE2) and the horizontal electric field (HE). For example, a ratio for the number of the first layer electrode patterns to the number of the second layer electrode patterns is designed to be 2 to 1, so that a ratio for the number of the fringe electric field FE1 (or FE2) to the number of horizontal electric field (HE) can be 1 to 1. The horizontal electric field (HE) can be adjacent to the first electrode layer, far away from the LC molecules. As a result, under the premise without significantly increasing fabrication cost, the display panel 1000 composed from the pixel structure 40 in the embodiment can have relatively low driving voltage and be good in LC response and aperture ratio.

Figure 16:
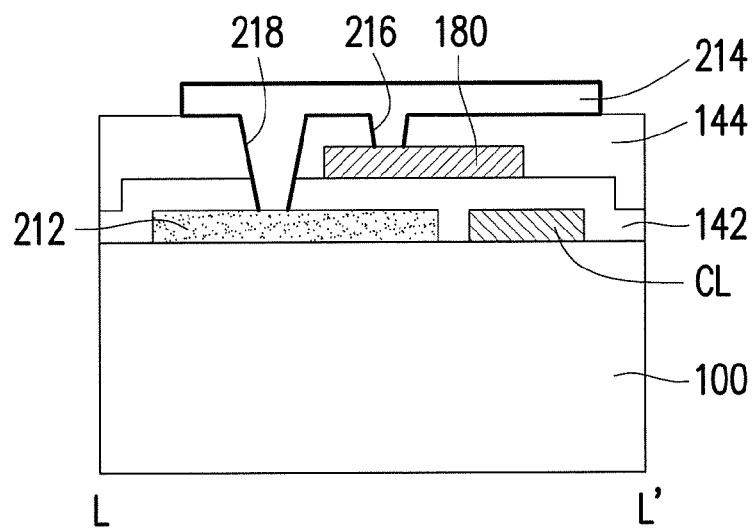
FIG. 16 is a drawing, schematically illustrating a cross-sectional view of the pixel structure, cutting at the line L-L' in FIG. 14.

FIG. 16 is a drawing, schematically illustrating a cross-sectional view of the pixel structure, cutting at the line L-L' in FIG. 14. Referring to FIG. 14 and FIG. 16, in the embodiment, the pixel electrode PE further includes interconnection structure of pixel electrode 210. The interconnection structure of pixel electrode 210 includes a first layer interconnection 212, a second layer interconnection 214, a first contact window 216 and a second contact window 218. The interconnection structure of pixel electrode 210 is similar to the interconnection structure of pixel electrode 110 of the pixel structure in previous embodiment, the like device elements are indicated by the like reference numerals without further descriptions. Referring to FIG. 16, the first contact window 216 is disposed on the active device T (not shown) of the conductive layer 180, and electrically connected to the first layer interconnection 212. The second contact window 218 electrically connected the second layer interconnection 214 and the first layer interconnection 212.

Figure 17:
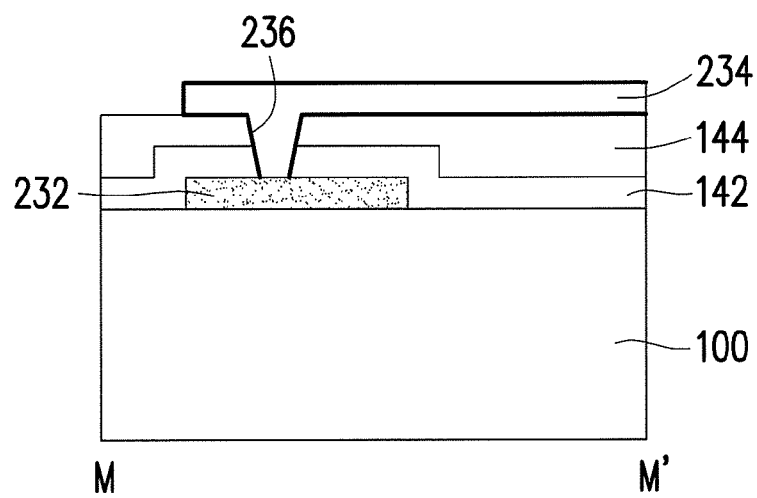
FIG. 17 is a drawing, schematically illustrating a cross-sectional view of the pixel structure, cutting at the line M-M' in FIG. 14.

FIG. 17 is a drawing, schematically illustrating a cross-sectional view of the pixel structure, cutting at the line M-M' in FIG. 14. Referring to FIG. 14 and FIG. 17, in the embodiment, the common electrode CE further includes an interconnection structure of common electrode 230. The interconnection structure of common electrode 230 includes a first layer interconnection 232, a second layer interconnection 234, and a contact window 236. The interconnection structure of common electrode 230 is similar to the interconnection structure of common electrode 130 of the pixel structure in previous embodiment, the like device elements are indicated by the like reference numerals without further descriptions. Referring to FIG. 17, insulating layers 142 and 144 are sequentially implemented between the second layer interconnection 234 and the first layer interconnection 232. The second layer interconnection 234 and the first layer interconnection 232 are electrically connected by the contact window 236.

Figure 18:
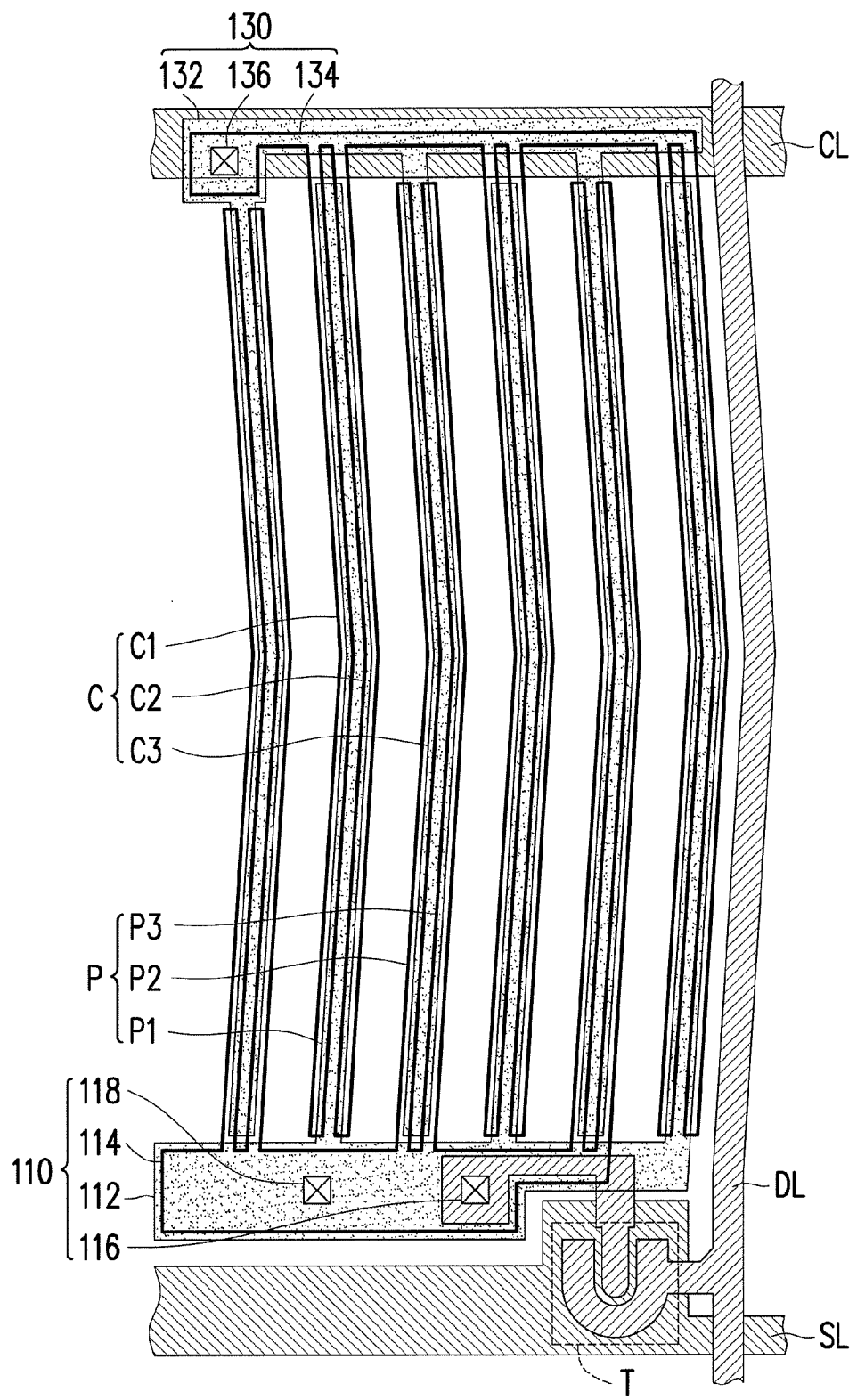
FIG. 18 is a drawing, schematically illustrating a top view of a pixel structure, according to further another embodiment of the invention.

FIG. 18 is a drawing, schematically illustrating a top view of a pixel structure, according to further another embodiment of the invention. Referring to FIG. 18, the pixel structure 50 shown in FIG. 18 includes a scan line SL, a data line DL, a common electrode line CL, an active device T, pixel electrode P and common electrode C. The pixel structure 50 shown in FIG. 18 is similar to the pixel structure 10 in FIG. 2, the like device elements are indicated by the like reference numerals without further descriptions. Referring to FIG. 2 and FIG. 18, the difference between the pixel structure 50 and the pixel structure 10 in FIG. 2 includes the geometric shape of the electrode patterns. In comparison with the pixel electrode patterns P1, P2 and P3 and the common electrode patterns C1, C2 and C3 of the pixel structure 10 as a straight line shape for the electrode patterns, in the embodiment, the pixel electrode patterns P1, P2 and P3 and the common electrode patterns C1, C2 and C3 of the pixel structure 50 are "《 " shape electrode patterns.

Based on the foregoing descriptions, the pixel electrode of the pixel structure in the invention includes multiple first layer pixel electrode patterns and second layer pixel electrode patterns. In addition, the common electrode of the pixel structure in the invention also includes multiple common electrode patterns. These common electrode patterns can be located at the same film layer or different film layers. A fringe electric field can be formed between each of the common electrode patterns and corresponding portion of the common electrode patterns at different film layer. In addition, a horizontal electric field can be formed between each of the common electrode patterns and corresponding portion of the common electrode patterns at the same film layer. As a result, in an embodiment of the invention, the LC driving mode can simultaneously have both the horizontal electric field and the fringe electric field in the same pixel structure. Under the premise without significantly increasing fabrication cost, the issue of over-large for FFS technology at large size can be reduced but also the issues in IPS technology about LC efficiency lower than that in FFS technology and the operation voltage higher than that in FFS technology can be reduced.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:
1. A pixel structure, comprising:
a scan line and a data line;
an active device, electrically connecting to the scan line and the data line;
a pixel electrode, electrically connecting to the active device, wherein the pixel electrode comprises a plurality of first layer pixel electrode patterns, a plurality of second layer pixel electrode patterns, and an interconnection structure of pixel electrode, the second layer pixel electrode patterns and the first layer pixel electrode patterns and the interconnection structure of pixel electrode are electrically connected, the active device is electrically connected with the interconnection structure of pixel electrode, the interconnection structure of pixel electrode comprises:
a first layer interconnection, connected to the first layer pixel electrode patterns;
a second layer interconnection, connected to the second layer pixel electrode patterns;
a first contact window, to electrically connect the active device with the first layer interconnection; and
a second contact window, to electrically connect the first layer interconnection and the second layer interconnection; and
a common electrode, electrically insulating from the pixel electrode, wherein the common electrode comprises a plurality of first layer common electrode patterns and a plurality of second layer common electrode patterns,
wherein a fringe electric field is between each of the first layer pixel electrode patterns and a corresponding portion of the second layer common electrode patterns and between each of the first layer common electrode patterns and a corresponding portion of the second layer pixel electrode patterns,
wherein a horizontal electric field is between each of the second layer pixel electrode patterns and an adjacent portion of the second layer common electrode patterns.
2. The pixel structure of claim 1, wherein the fringe electric field is between each one of the first layer pixel electrode patterns and at least corresponding two of the second layer common electrode patterns, and between each one of the first layer common electrode patterns and at least corresponding two of the second layer pixel electrode patterns.
3. The pixel structure of claim 2, wherein each of the first layer pixel electrode patterns and the at least corresponding two of the second layer common electrode patterns form a first electrode set of fringe electric field, the each one of the first layer common electrode patterns and the at least corresponding two of the second layer pixel electrode patterns form a second electrode set of fringe electric field, and the horizontal electric field is between the first electrode set of fringe electric field and the second electrode set of fringe electric field.
4. The pixel structure of claim 1, wherein,
a line width of the each one of the first layer pixel electrode patterns and each one of the first layer common electrode patterns is greater than 0 and less than or equal to 30 μm, a line width of the each one of the second layer pixel electrode patterns and each one of the second layer common electrode patterns is greater than 0 and less than or equal to 10 μm, a gap between the each one of the second layer pixel electrode patterns and the adjacent portion of the second layer common electrode patterns is greater than 0 and less than or equal to 30 μm, a gap between the each one of the second layer pixel electrode patterns and the adjacent portion of the second layer pixel electrode patterns is greater than 0 and less than or equal to 20 μm, and a gap between the each one of the second layer common electrode patterns and the adjacent portion of the second layer common electrode patterns is greater than 0 and less than or equal to 20 μm.

5. The pixel structure of claim 1, wherein the common electrode further comprises an interconnection structure of common electrode, the second layer common electrode patterns and the first layer common electrode patterns are electrically connected to the interconnection structure of common electrode, and the interconnection structure of common electrode is electrically connected to a common electrode line.

6. The pixel structure of claim 5, wherein the interconnection structure of common electrode comprises:

a first layer interconnection, connecting to the first layer common electrode patterns, and the first layer interconnection electrically contacts with the common electrode line;

a second layer interconnection, connecting to the second layer common electrode patterns;

a contact window, to electrically connect the second layer interconnection with the first layer interconnection.

7. The pixel structure of claim 1, wherein the first layer pixel electrode patterns and the second layer pixel electrode patterns are parallel with the data line, and the first layer common electrode patterns and the second layer common electrode patterns are parallel with the data line.

8. A pixel structure, comprising:

a scan line and a data line;

an active device, electrically connecting to the scan line and the data line;

a pixel electrode, electrically connecting to the active device, wherein the pixel electrode comprises a plurality of first layer pixel electrode patterns, a plurality of second layer pixel electrode patterns, and an interconnection structure of pixel electrode, the second layer pixel electrode patterns and the first layer pixel electrode patterns are electrically connected to the interconnection structure of pixel electrode, the active device is electrically connected to the interconnection structure of pixel electrode, and the interconnection structure of pixel electrode comprises:

a first layer interconnection, connected to the first layer pixel electrode patterns;

a second layer interconnection, connected to the second layer pixel electrode patterns;

a first contact window, to electrically connect the active device with the first layer interconnection; and a second contact window, to electrically connect the first layer interconnection and the second layer interconnection; and a common electrode, electrically insulating from the pixel electrode, wherein the common electrode comprises a plurality of common electrode patterns, wherein a fringe electric field is between each of the first layer pixel electrode patterns and a corresponding portion of the common electrode patterns, wherein a horizontal electric field is between each of the second layer pixel electrode patterns and an adjacent portion of the common electrode patterns.

9. The pixel structure of claim 8, wherein the fringe electric field is between each of the first layer pixel electrode patterns and at least corresponding two of the common electrode patterns.

10. The pixel structure of claim 9, wherein each of the first layer pixel electrode patterns and the at least corresponding two of the common electrode patterns form an electrode set of fringe electric field, and the horizontal electric field is between the electrode set of fringe electric field and an adjacent portion of the second layer pixel electrode patterns.

11. The pixel structure of claim 8, wherein, a line width of the each one of the first layer pixel electrode patterns is greater than 0 and less than or equal to 30 μm, a line width of the each one of the second layer pixel electrode patterns and each one of the common electrode patterns is greater than 0 and less than or equal to 10 μm, a gap between the each one of the second layer pixel electrode patterns and an adjacent portion of the common electrode patterns is greater than 0 and less than or equal to 30 μm, and a gap between the each one of the common pixel electrode patterns and an adjacent portion of the common electrode patterns is greater than 0 and less than or equal to 20 μm.

12. The pixel structure of claim 8, wherein the common electrode further comprises an interconnection structure of common electrode, the common electrode patterns and the interconnection structure of common electrode are electrically connected, and the interconnection structure of common electrode is electrically connected to a common electrode line.

13. The pixel structure of claim 8, wherein the first layer pixel electrode patterns and the second layer pixel electrode patterns are parallel with the data line and the common electrode patterns are parallel with the data line.

* * * * *